(12) United States Patent
Reimer et al.

(10) Patent No.: US 7,077,159 B1
(45) Date of Patent: Jul. 18, 2006

(54) PROCESSING APPARATUS HAVING INTEGRATED PUMPING SYSTEM

(75) Inventors: Peter Reimer, Los Altos, CA (US);
Pedram Sabouri, Santa Clara, CA (US); Dennis R. Smith, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/220,153

(22) Filed: Dec. 23, 1998

(51) Int. Cl.
*C23C 16/00* (2006.01)

(52) U.S. Cl. .......................... 137/565.23; 137/565.17; 137/565.3; 137/565.33; 118/708; 118/715; 118/719

(58) Field of Classification Search ................ 118/715, 118/708, 719; 137/565.17, 565.23, 565.3, 137/565.33
See application file for complete search history.

(56) References Cited

U.S. PATENT DOCUMENTS

| | | | | |
|---|---|---|---|---|
| 4,534,314 A | * | 8/1985 | Ackley ........................ | 118/733 |
| 4,983,107 A | * | 1/1991 | Steffens et al. ................ | 418/9 |
| 5,174,827 A | * | 12/1992 | Misiano ...................... | 118/719 |
| 5,575,853 A | * | 11/1996 | Arami ........................ | 118/715 |
| 5,651,867 A | * | 7/1997 | Kokaku ...................... | 118/719 |
| 5,685,963 A | * | 11/1997 | Lorimer et al. ........ | 204/298.03 |
| 5,709,753 A | * | 1/1998 | Olson ........................ | 118/719 |
| 5,733,104 A | * | 3/1998 | Conrad et al. ............. | 417/44.1 |
| 5,904,952 A | * | 5/1999 | Lopata ........................ | 427/8 |
| 5,944,049 A | * | 8/1999 | Beyer et al. ............. | 137/487.5 |
| 6,080,679 A | * | 6/2000 | Suzki ........................ | 118/715 |
| 6,251,192 B1 | * | 6/2001 | Kawamura et al. ......... | 118/719 |
| 6,382,249 B1 | * | 5/2002 | Kawasaki et al. ....... | 137/565.3 |

FOREIGN PATENT DOCUMENTS

| | | |
|---|---|---|
| EP | 0 377 464 A2 | 7/1990 |
| EP | 0 398 365 A2 | 11/1990 |
| EP | 0 452 939 A1 | 10/1991 |
| EP | 0 698 915 A1 | 2/1996 |
| EP | 1 014 427 A | 6/2000 |
| JP | 2-184333 | 7/1990 |
| JP | 4-358531 | 12/1992 |
| JP | 6-29367 | 2/1994 |
| JP | 7-167053 | 7/1995 |
| JP | 8-74041 | 3/1996 |
| JP | 9-168732 | 6/1997 |
| JP | 9-251981 | 9/1997 |
| WO | WO 98/48168 | 10/1998 |

OTHER PUBLICATIONS

O'Hanlon, A User's Guide to Vacuum Technology, 2nd Ed, John Wiley & Sons, New York pp. 349-354, 1989.*

(Continued)

*Primary Examiner*—Richard Bueker
(74) *Attorney, Agent, or Firm*—Patterson & Sheridan LLP

(57) ABSTRACT

An apparatus 115 for processing a substrate 20, comprises an integrated pumping system 155 having a high operating efficiency, small size, and low vibrational and noise levels. The apparatus 115 comprises a chamber, such as a load-lock chamber 110, transfer chamber 115, or process chamber 120. An integrated and local pump 165 is abutting or adjacent to one of the chambers 110, 115, 120 for evacuating gas from the chambers. The pump has an inlet 170 connected to a chamber 110, 115, 120, and an outlet 175 that exhausts the gas to atmospheric pressure. Preferably, the pump 165 comprises a pre-vacuum pump or a low vacuum pump.

12 Claims, 12 Drawing Sheets

OTHER PUBLICATIONS

Garay, Pump Application Desk Book, The Fairmont Press, 1996, pp. 18-24.*

Various pages describing a Model IPX100 Dry Vacuum Pump and illustration showing the position of the pump relative to a semiconductor processing apparatus, 4 pps.

PCT Search Report dated Nov. 26, 2004; Application No. 99310475.1-2203.

European Search Report dated Feb. 11, 2005 for European Application No. EP 01301242.2 (AMAT/2981EP02).

* cited by examiner

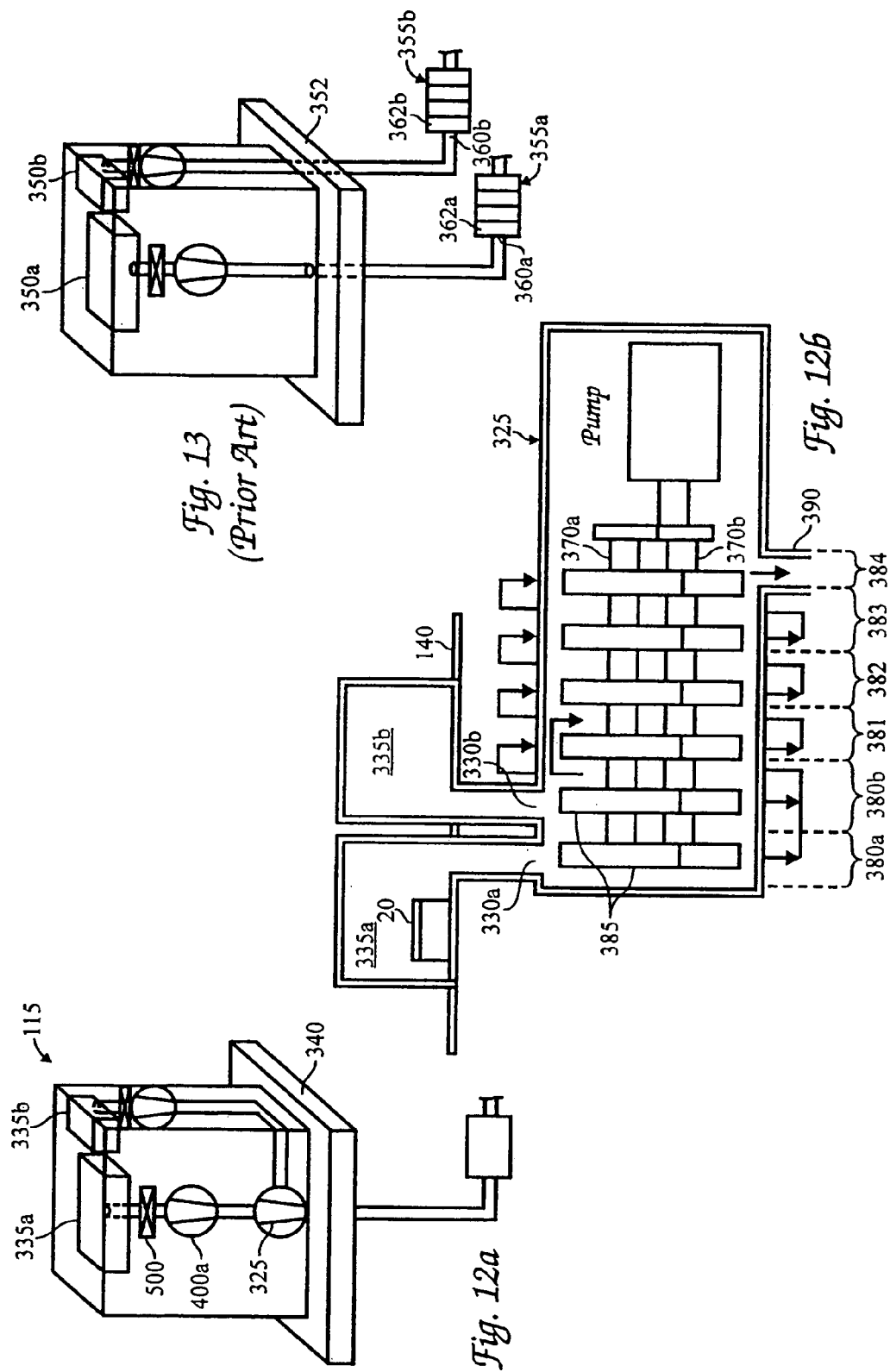

PROCESSING APPARATUS HAVING INTEGRATED PUMPING SYSTEM

BACKGROUND

The present invention relates to an apparatus for processing substrates that has a pumping system for evacuating gas.

An apparatus 15 for processing a substrate 20 comprises process chambers 25a, transfer chambers 25b, and load-lock chambers 25c mounted contiguously on a platform 28 with openings for transferring substrates between the chambers, as shown in FIG. 1. In the process chamber 25a, a process gas or plasma is used to etch features, deposit layers of material on a substrate 20, or clean the chamber. The apparatus 15 is in a clean or semi-clean room 30, and a pumping system 35 used to evacuate gas and maintain the chambers at a low pressure is in an adjacent room or basement. The pumping system 35 typically comprises a high vacuum pump 40, such as a turbo molecular pump; a low vacuum pump 45, such as a rotary blower pump; and a pre-vacuum pump 50a–c, such as a dry vacuum pump. Typically, the inlet 55 of the high vacuum pump 40 is connected to the process chamber 25, and its outlet 60 to a foreline 65 that extends from the chamber to the intake 70 of the low vacuum pump 45, which in turn, is coupled to the intake of the pre-vacuum pump 50a. The pre-vacuum pump 50a exhausts to an exhaust scrubber 72. The pre-vacuum pump 50a reduces the pressure of the process chamber 25a from atmospheric pressure (760 Torr) down to a pressure of about 0.01 Torr; the low vacuum pump 45 drops the chamber pressure down to about 0.0005 Torr; and only when the chamber pressure is below 0.1 Torr is the high vacuum pump 40 operated to achieve a high vacuum below 0.1 Torr down to $10^{-7}$ Torr. Another type of high vacuum pump is the cryo pump, which is used alone or in conjunction with the turbomolecular pump. A pre-vacuum pump 50 is also used in conjunction with cryo pump (not shown) to pump down the process chambers fast. Pre-vacuum pumps 50 and low vacuum pumps 45 are most commonly used in semiconductor processing apparatus; however, some semiconductor processing apparatus also use high vacuum pumps or cryo pumps in conjunction with the pre-vacuum and low vacuum pumps. A low vacuum pump 50 is essentially a pre-vacuum pump 45 whose pumping performance is enhanced, for example, a pre-vacuum pump with an added blower can operate as a low vacuum pump 50.

The forelines 65a–c between the pumps 40, 45, 50a–c and the chambers 25a–c have a large diameter to provide a high conductance pathway that has a reduced pumping load and resistance. The low vacuum pump 45 and the pre-vacuum pumps 50 are large sized pumps that occupy volumes of from 0.5 to 1 $m^3$, large footprint 0.5 $m^2$, and they are noisy and vibrate excessively during operation. That is why these pumps are typically located in a separate room below or adjacent to the clean room to save clean room space and to mechanically isolate the pump vibrations from the sensitive processing equipment. The distance between the two rooms can often require a 50 to 100 feet length of foreline 65a–c. These extended lengths require that the forelines 65a–c have a large diameter and low conductance to operate the low and pre-vacuum pumps with any reasonable efficiency. Typically, the foreline 65a–c is a stainless steel pipe, which resists corrosion from the process gas, having a diameter of 50 to 100 mm (2 to 4 inches). However, the large diameter stainless steel pipe is expensive and a long length of pipe can cost as much as the pump itself. In addition, the large number of elbow joints and connections in the long foreline extending from the clean room to a separate room, have to be carefully sealed with non-corrodible gas seals to avoid leaks and releasing hazardous and toxic gases during operation, which further adds to large capital costs in semiconductor fabrication facilities. Also, the pipes are often heated to reduce the deposition of condensates on the inside surfaces of the pipes which wastes energy.

Furthermore, even with large diameter forelines 65a–c, the efficiency of the low and pre-vacuum pumps 45, 50a–c is often decreased by a factor of 2 to 4 because of the loss in pumping efficiency caused by the large length of intervening pipeline. This is especially true when the chambers are pumped down to a low pressure mTorr range, where an increase in length of the forelines 65a–c results in a large reduction in conductance. Another problem is that the large diameter and long length of the forelines 65a–c provide a large surface area that serves as a heat sink upon which condensates are deposited from the process gas flowing in the lines. These condensates are dislodged and loosened by vibrations from the pumps 45, 50a–c and back diffusion into the chambers 25a–c to contaminate and reduce the yield of the substrates 20.

Yet another problem of conventional apparatus arises because the pressure of gas in the chambers 25a–c cannot be reduced in a responsive or fast manner. Typically, the chamber pressure is measured by the pressure gauge 80 which feeds a pressure signal to a throttle valve controller 90 which opens or closes the throttle valve 75a,b to control the pressure of gas in the chamber 25a–c. However, this system is slow to respond to pressure fluctuations caused by entry of substrates 20 in the chambers 25a–c, transfer of substrates, or changes in a gas flow rate. In addition, the pressure reduction time obtained from "soft start" valves 76 are too slow. The soft gradual pressure reduction is used to prevent moisture condensation when lowering chamber pressure from atmospheric pressures to the mTorr range, by using two different size valves 76. A smaller valve opening having a low conductance is opened when pumping the chamber down from one atmosphere to about 100 to 300 Torr, and a large sized valve is opened when pumping the chamber down to lower pressures. The two-cycle process provides a soft or gradual reduction in chamber pressure in stages that minimizes moisture condensate in the chambers 25a–c. However, the time for pressure reduction during the small valve opening step of the process is often excessively long for high throughout fabrication processes.

Thus, it is desirable to have a semiconductor processing apparatus having a pumping system that does not require excessively long forelines with large diameters to operate efficiently. It is also desirable to have a small pump having reduced vibrations and noise for use in a clean room environment. It is further desirable to reduce the diameter, surface area, and length of the forelines between the chambers and the pumping system. It is also desirable to control the pressure in the chamber by means other than valves to increase response time and reduce particles. It is also desirable to more closely follow the pressure reduction versus time curve in the chamber to reduce pump down time. It is also desirable to reduce power consumption, cooling water consumption, and the release of heat within the clean room environment. It is also desirable to achieve all of the above with a small pump operating with a rotational speed of less than 10,000 revolutions per minute in order to minimize time for pressure adjustment; minimize noise, vibration, and power consumption; and maximize bearing lifetime and pump reliability.

SUMMARY

The present invention is to a semiconductor processing apparatus for processing a semiconductor substrate, having a pumping system with high operating efficiency, small size, and low vibrational and noise levels. In one aspect, the present invention comprises an apparatus for processing a substrate using a chamber, such as a load-lock chamber, transfer chamber, or process chamber. A pump is adjacent to the chamber, the pump having an inlet connected to the chamber for evacuating gas in the chamber and an outlet that exhausts the evacuated gas to atmospheric pressure. A foreline can extend between the inlet of the pump and the chamber, the foreline preferably having a length of less than about 2 m and a diameter of less than about 80 mm. Alternatively, the apparatus is substantially absent a foreline between the inlet of the pump and the chamber. Preferably, the pump comprises a pre-vacuum or low vacuum pump.

In another aspect, the present invention comprises an apparatus for processing a substrate, the apparatus comprising a chamber, a pump, and a pressure controller for controlling a gas pressure in the chamber by providing a signal in relation to the gas pressure to a pump controller that changes the speed of the pump in relation to the signal. In use, gas is evacuated from a chamber by the pump and the pressure of the gas in the chamber is regulated by adjusting a speed of the pump. In a process chamber, a substrate is placed on a support in the evacuated chamber, gas is introduced into the chamber and optionally energized to process the substrate, and the pressure of the gas in the chamber is regulated by adjusting a speed of the pump.

In yet another aspect, the present invention comprises an apparatus for processing a substrate, comprising a pump having a plurality of inlet ports, a first inlet port provided to evacuate gas from a first chamber or first pump, and a second inlet port provided to evacuate gas from a second chamber or second pump. Preferably, the first and second inlet ports are connected to one or more inlet stages of the pump.

In another embodiment, the apparatus comprises a plurality of chambers having enclosures shaped and sized to hold one or more substrates, and a pump having a first inlet port in a first inlet stage, and a second inlet port in a second inlet stage, the first inlet port provided to evacuate gas from one chamber or pump, and the second inlet port provided to evacuate gas from another chamber or pump. Preferably, the plurality of chambers are mounted on a single platform, and the pump abuts the platform.

DRAWINGS

These and other features, aspects, and advantages of the present invention will become better understood with regard to the following description, appended claims, and accompanying drawings which illustrate examples of preferred embodiments of the invention, where:

Figure 8B:
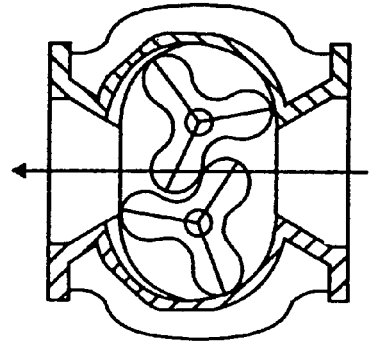
Figure 8D:
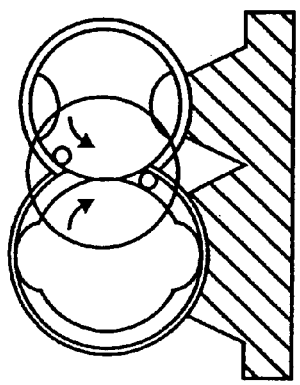
Figure 8A:
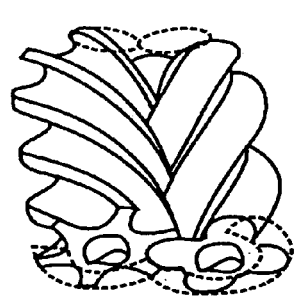
Figure 8C:
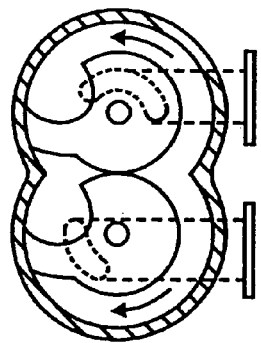
Figure 9:
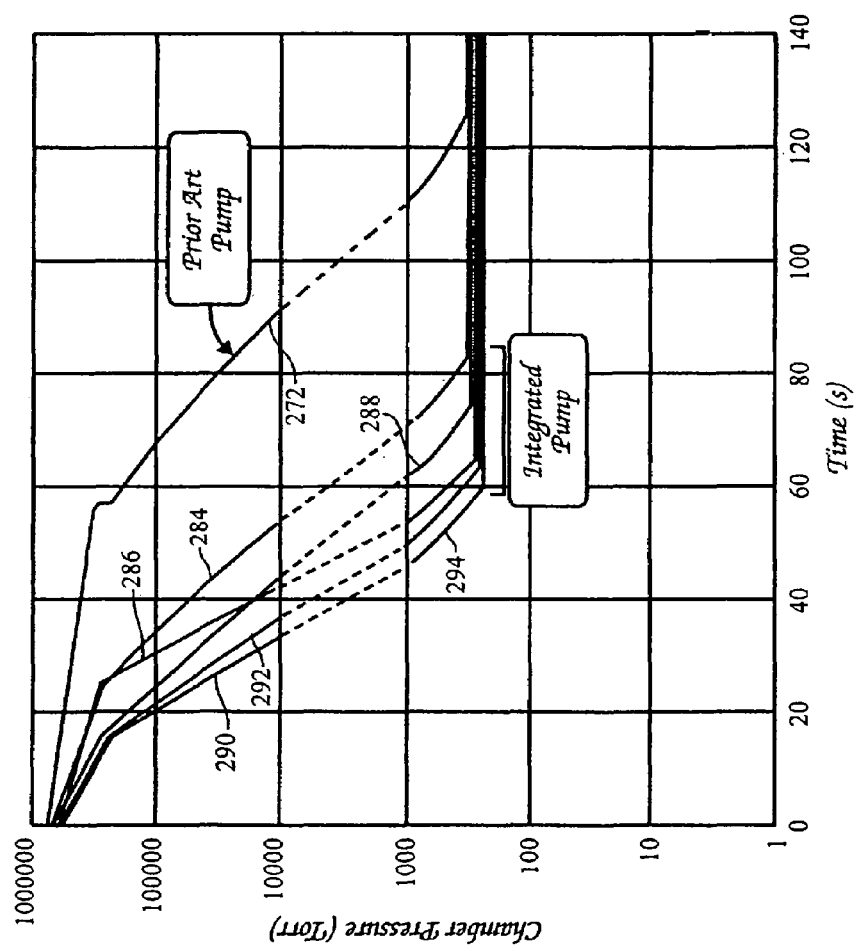
Figure 10:
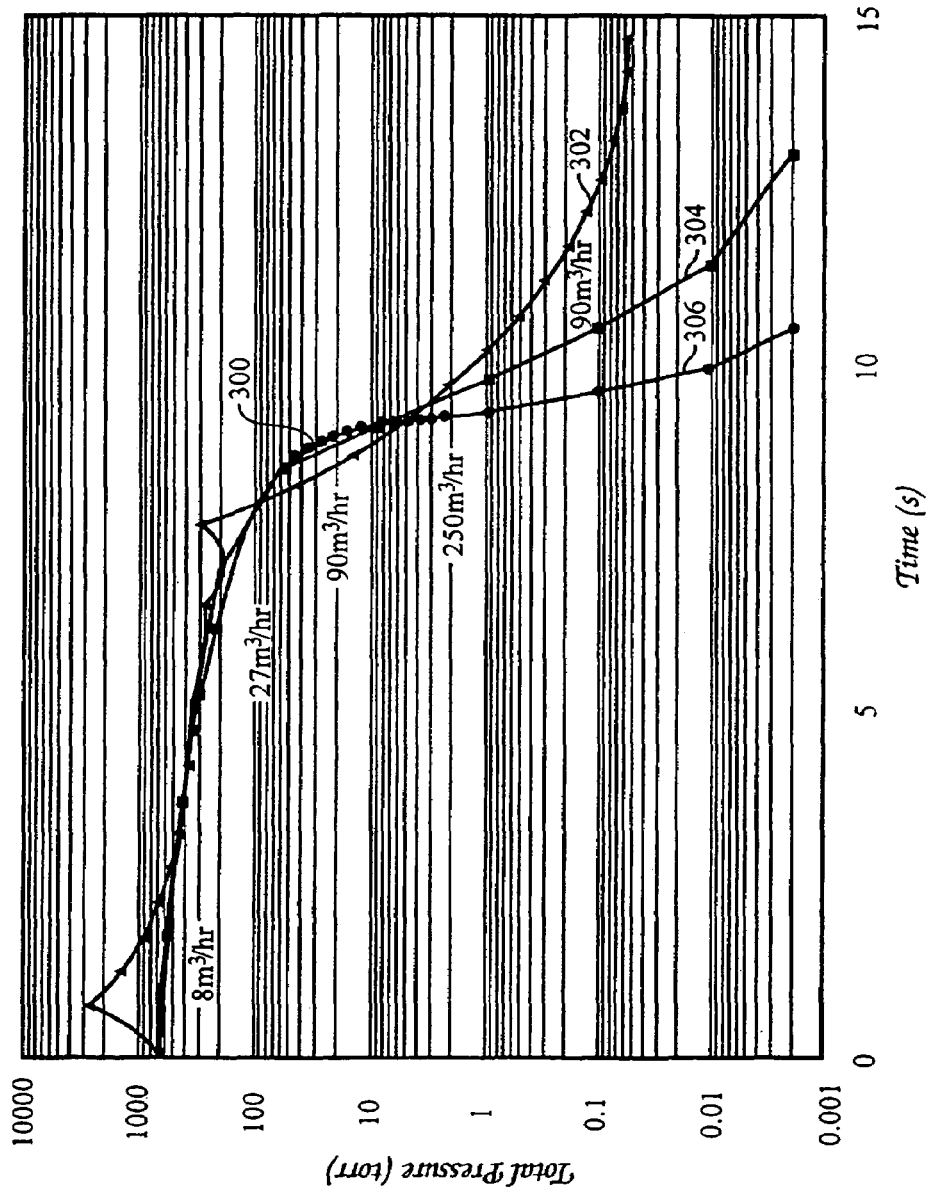
Figure 11:
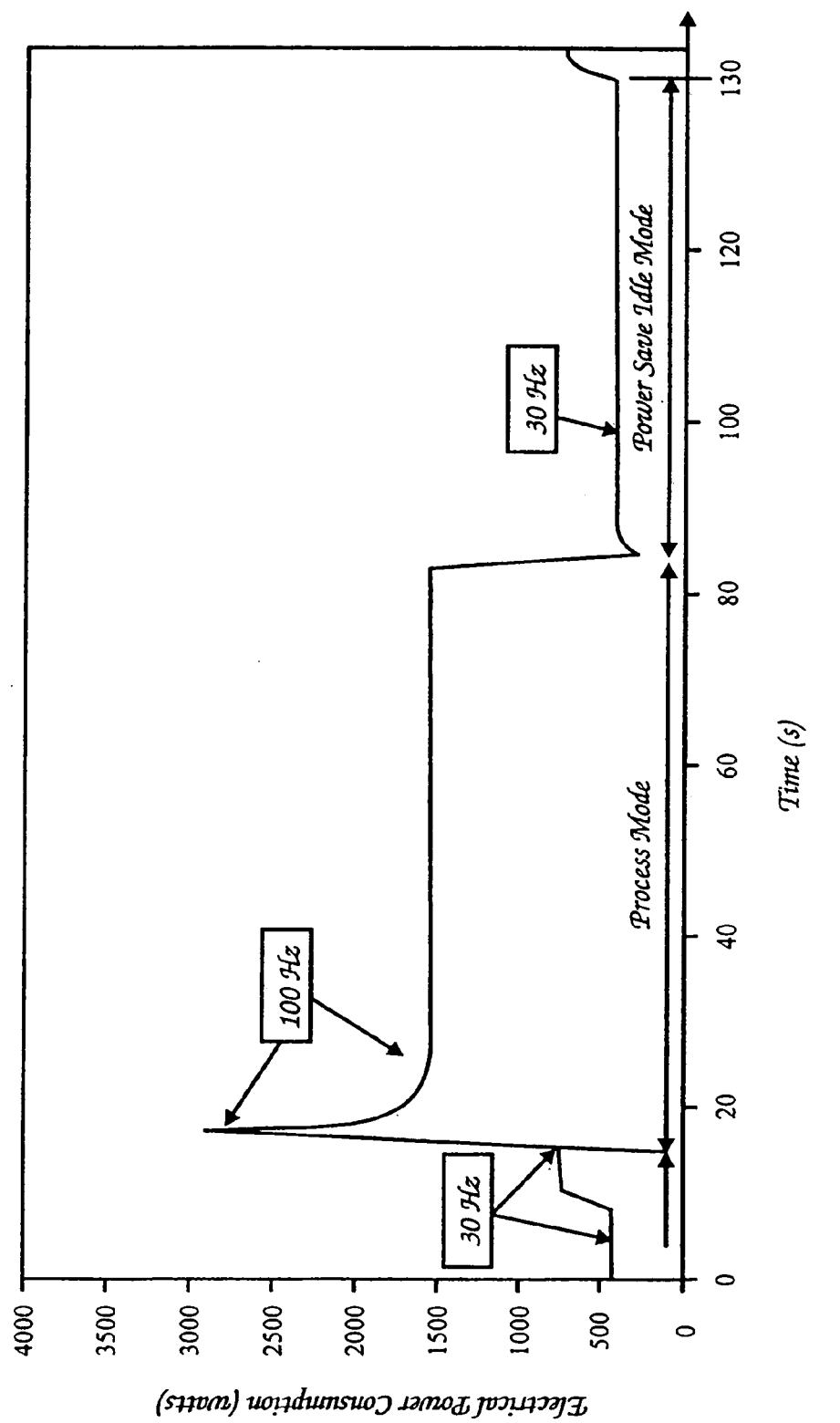

FIG. 8*a* is a schematic side view of a low vacuum pump having an auger screw on a shaft;

FIG. 8*b* is a schematic side view of a low vacuum pump having a roots-type mechanism;

FIG. 8*c* is a schematic side view of a low vacuum pump having a rotor with an interdigited hook and claw assembly;

FIG. 8*d* is a schematic side view of a low vacuum pump having an interdigited tongue and groove assembly;

FIG. 9 is a graph of chamber pressure versus pumping time for different pump down cycles comparing local and remote pumping systems for a given chamber size;

FIG. 10 is a graph showing a computer-generated model of an optimal pressure reduction curve to avoid ice condensation in a chamber, and various chamber pressure reduction curves obtained for different sets of selected pump speeds;

FIG. 11 is a graph of the electrical power consumption of a pumping system showing the energy savings obtained during a typical pump down operating cycle;

FIG. 12*a* is a schematic diagram of a semiconductor processing apparatus of the present invention showing multiple chambers connected to different stages of a single pre-vacuum pump;

FIG. 12*b* is a sectional schematic side view of the pre-vacuum pump of FIG. 12*a* showing a plurality of inlets ports and inlet stages; and FIG. 13 (prior art) is a schematic diagram of a conventional semiconductor processing apparatus showing multiple chambers that are each evacuated by separate pumping system.

DESCRIPTION

Figure 2:
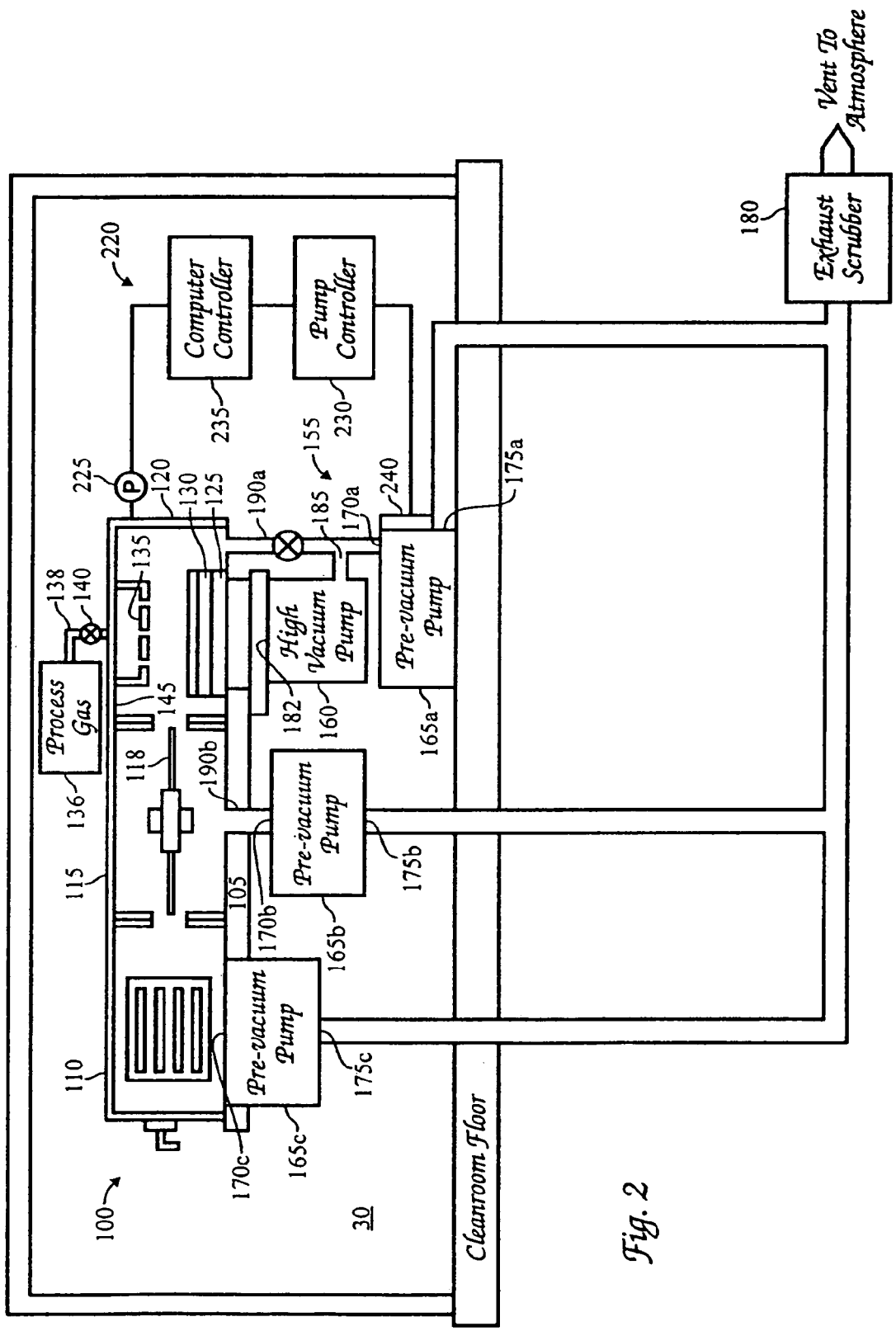
FIG. 2 is a schematic view of a semiconductor processing apparatus according to the present invention showing chambers having abutting or adjacent pre-vacuum pumps that are substantially absent long forelines, too many valves.

An exemplary apparatus 100 according to the present invention for processing a substrate 20, such as a silicon wafer, is illustrated in FIG. 2. The apparatus 100 comprises a platform 105 having a plurality of chambers each of which are shaped and sized to hold or enclose one or more substrates 20. The chambers are interfaced to one another and typically include load-lock chambers 110, a transfer chambers 115, and process chambers 120, that are mounted contiguously with openings to transfer substrates therebetween. The load-lock chambers 110 hold cassettes that contain batches of substrates 20. The centrally located transfer chamber 115 comprises a robot arm 118 which picks up and transfer substrates 20 from the cassette in the load-lock chamber 110 into a process chamber 120, and after processing of the substrate in the chamber 120, transfers the substrate to other process chambers (not shown) on the platform 105. When the substrate 20 has finished processing, the robot 118 picks it up from the last process chamber and transfers it to another load-lock chamber (not shown) reserved for unloading. Although the present invention is illustrated by an apparatus for processing substrates, such as semiconductor wafers, the invention can also be used for processing other substrates, such as flat panel displays, circuit boards, and liquid crystal displays, and in other chambers as apparent to those skilled in the art and without deviating from the scope of the invention.

The process chamber 120 forms an enclosure for a support 125 for supporting a substrate 20, such as a semiconductor wafer. The substrate 20 is held on the support 125 by an electrostatic chuck 130. Metals commonly used to fabricate the process chamber are for example, anodized aluminum, stainless steel, INCONEL™, silicon oxide, boron carbide, or aluminum oxide. The support 125 is typically made from aluminum with an anodized coating resistant to corrosion in the process gas. A process gas distributor 135 comprises a plurality of nozzles that are spaced apart and distributed to flow process gas around the substrate 20. The process gas is supplied from one or more process gas supplies 136 via process gas lines 138 and their flow rate regulated by flow control valves 140. The process gas is energized to process a substrate by a process gas energizer that couples electromagnetic RF or microwave energy to the process gas to form an energized process gas or plasma. The process gas can be activated in the chamber 120 by inductive coupling by applying an RF current to an inductor coil (not shown) encircling the chamber. In the embodiment shown in FIG. 2, the process gas is energized by capacitive coupling RF energy to process electrodes in the chamber 120. Preferably, at least a portion of the support 125 comprises an electrically conductive metal electrode that is chargeable to serve as the process electrode. A partially facing conducting or semiconducting portion of a ceiling 145 of the chamber serves as the other process electrode. The frequency of the RF applied to the process electrodes is typically about 50 KHz to about 60 MHZ, and more typically about 13.56 MHZ. The RF voltage applied to the process electrodes is at a power level of from about 100 to about 2000 Watts; and/or an RF current at a power level of from about 750 to about 2000 Watts is applied to the inductor coil.

In operation, one or more substrates are placed in the process chamber 120 which is evacuated by a pumping system 155. The process chamber 120 can be used to deposit material on a substrate 20 such as by chemical or physical vapor deposition or etch layers on the substrate. Chemical vapor deposition processes that can be performed in the apparatus 100 to deposit coatings on the substrate are generally described in VLSI Technology, 2nd Ed., Ed. by Sze, McGraw-Hill Publishing Co., New York, which is incorporated herein by this reference. For example, typical CVD processes for depositing $SiO_2$ use a silicon source gas, for example $SiH_4$ or $SiCl_2H_2$, and an oxygen source process gas such as $CO_2$ and $H_2O$, or $N_2O$; or a process gas containing both silicon and oxygen such as $Si(OC_2H_5)_4$. $Si_3N_4$ is deposited from gases such as $SiH_4$ and $NH_3$ or $N_2$. Other commonly used process gases include $NH_3$, $WF_6$, and $SiH_4$. The apparatus can also be used for etching dielectric and metal layers, as generally described in VLSI Technology by S. M. Sze, McGraw-Hill Publishing Company (1988), which is also incorporated herein by reference. Typical metal etching processes use gases such as HBr, $BCl_3$, $Cl_2$, HCl, $SF_6$, $CF_4$, and $CHF_3$. Resist stripping processes use $O_2$ and other gases to strip resist from the substrate. Cleaning gases for cleaning the chamber include $NF_3$ and $CF_4$.

An integrated and locally positioned pumping system 155 evacuates and exhausts the gas from one or more of the chambers. The load-lock chamber 110 is evacuated each time a new batch of substrates is placed in or removed from the chamber. Generally, the transfer chamber 115 containing the robot arm 118 is maintained at a low pressure during the entire processing sequence. The process chamber 120 is evacuated before introducing process gas in the chamber to process the substrate 20, after processing of the substrate, and during cleaning by cleaning gas. The pumping system 155 can comprise separate pumps for each chamber, assemblies or sets of pumps, or a single pump for multiple chambers, as described below.

A preferred integrated pumping system 155 for the process chamber 120 comprises a high vacuum pump 160 and a pre-vacuum pump 165a—both of which are positioned locally in the immediate environment around the chambers, as shown in FIG. 2, and not in a separate or distal environment. In one embodiment, the pumping system 155 comprises a pre-vacuum pump 165a adjacent to or abutting the chamber, having an inlet 170a connected to the chamber to evacuate gas from the chamber, and having an outlet 175a that exhausts the evacuated gas to atmospheric pressure via an exhaust scrubber 180. The pre-vacuum pump 165a is capable of evacuating the gas in the chamber 120 from atmospheric pressure to a pressure of less than about $10^{-2}$ Torr range. In addition, the high vacuum pump 160 is provided to drop the chamber pressure down from the low pressure range to high vacuum of $10^{-3}$ Torr range. The high vacuum pump 160 has an inlet 182 connected to the chamber and an outlet 185 that exhausts directly to the pre-vacuum pump 165a. The high vacuum pump 160 is capable of evacuating the chamber from a pressure of about $10^{-2}$ Torr to a pressure as low as about $10^{-9}$ Torr, and it cannot exhaust gas to atmospheric pressure. Also, the high vacuum pump 160 can only operate within a narrow and low pressure range and cannot pump down the chamber from atmospheric pressure. Only after the pre-vacuum pump 165a pumps down the chamber to a low pressure can the high vacuum pump 160 be operated to further reduce the chamber pressure to ultra-low pressures.

Generally, the load-lock chamber 110 and the transfer chamber 115 do not need a high vacuum pump 160 because they do not need to be pumped down to a high vacuum. Thus, these chambers have only a pre-vacuum pump 165b,c having an inlet 170b,c connected to one of the chambers 110, 115 for evacuating the gas from the chamber and an outlet 175b,c that exhausts the process gas directly to atmospheric pressure via the exhaust scrubber 180. The transfer chamber 115 has a short length of foreline 190b or has no forelines between the inlet 170b of the pre-vacuum pump 165b and the chamber 115. The load-lock chamber 110 has a short length of foreline or does not have any forelines 190a,b between the inlet 170c of the pre-vacuum pump 165c and the chamber 110 because the pump is connected directly to and abutting the load-lock chamber 110.

It has been discovered that the process efficiency and pump down time of the chambers can be substantially improved by changing the configuration and location of the pumping system 155 relative to the chambers 110, 115, 120. In one aspect, the apparatus of the present invention comprises a short length of foreline 190a,b, or no foreline at all, between the chambers 110, 115, 120 and their associated pumps 165b,c or set of pumps 160, 165a. For example, in the exemplary process chamber of the apparatus, a foreline having a length of about 0.5–2 m extends from the pre-vacuum pump 165a to the process chamber. The inlet of the high vacuum pump 182 is connected to the chamber, and its outlet to the foreline. In the transfer chamber, the pump is connected directly to the transfer chamber with or without a foreline having a short length of 0–2 m. For the load-lock chamber, the pre-vacuum pump 165c is coupled to the chamber with or without any foreline. Preferably, the inlet between the pump feeds to the chamber through a short foreline having a length of less than about 2 m, and more preferably less than 0.5 m.

Figure 1:
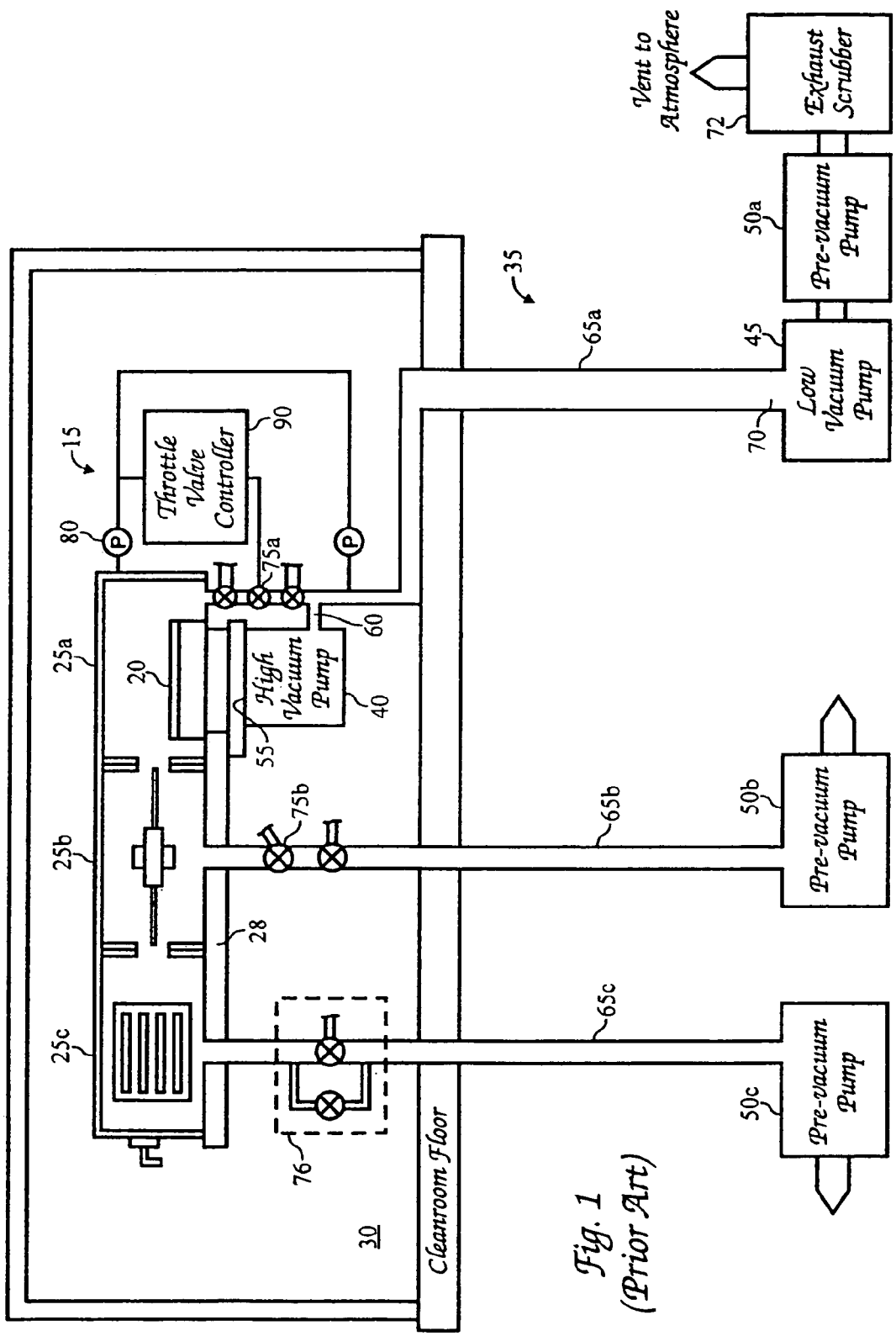
FIG. 1 (prior art) is a schematic view of conventional semiconductor processing apparatus for processing a substrate showing multiple chambers connected to a pumping system comprising high vacuum pumps, low vacuum pumps, pre-vacuum pumps, and an exhaust scrubber.
Figure 3:
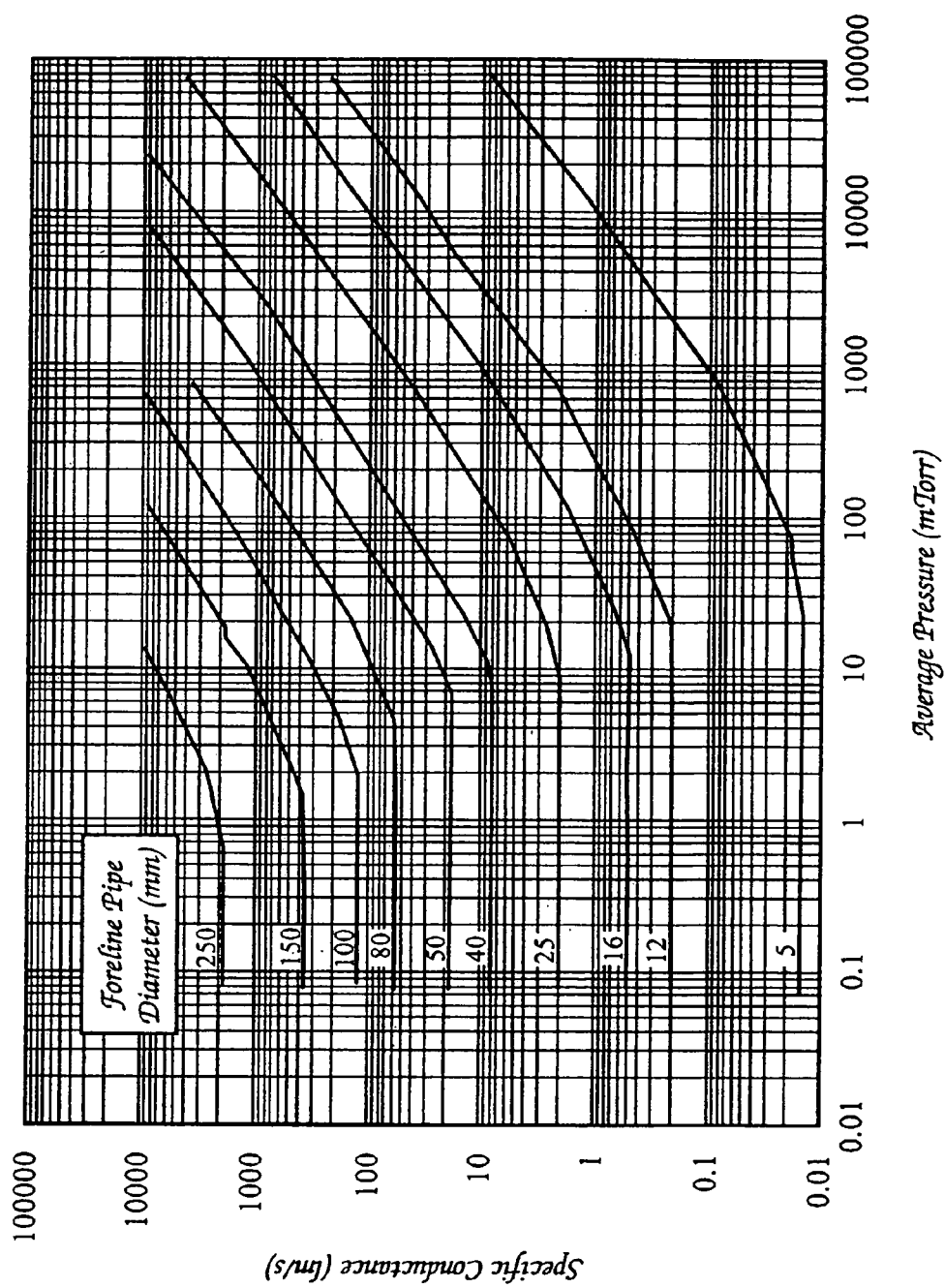
FIG. 3 is a graph showing the specific foreline conductance for increasing gas pressures and for different pipe diameters.

It has been discovered that the losses in pumping efficiency obtained are largely due to the losses in pumping conductance that arises from a long length of foreline between the pump and the chamber, as shown and described for a conventional apparatus in FIG. 1. FIG. 3 shows the specific conductance of foreline pipes for increasing gas pressure in a chamber and for different foreline pipe diameters. For a given foreline pipe diameter, as the gas pressure increases, the specific conductance of the foreline does not change from gas pressures of about 0.1 to about 1–10 mTorr, and thereafter, the specific conductance increases sharply for increasing gas pressure. However, as the foreline pipe diameter increases from 5 to 250 mm, the average chamber pressure at which the specific conductance begins to increase, drops down from 10 mTorr down to 1 mTorr. For example, FIG. 3 shows that at an average foreline pressure of 500 mTorr, the specific conductance of forelines with diameters 40 mm and 100 mm change drastically from 250 lm/s to 9000 lm/s, respectively. This means the conductance of a foreline with 1 m length and 40 mm diameter is 250 l/s, and the conductance of a foreline with 1 m length and 100 mm diameter is 9000 l/s. The conductance of a foreline with 10 m length and 40 mm diameter is 25 l/s, and the conductance of a foreline with 10 m length and 100 mm diameter is 900 l/s. Therefore, the length and diameter of the foreline has a substantial impact on conductance.

Figure 4:
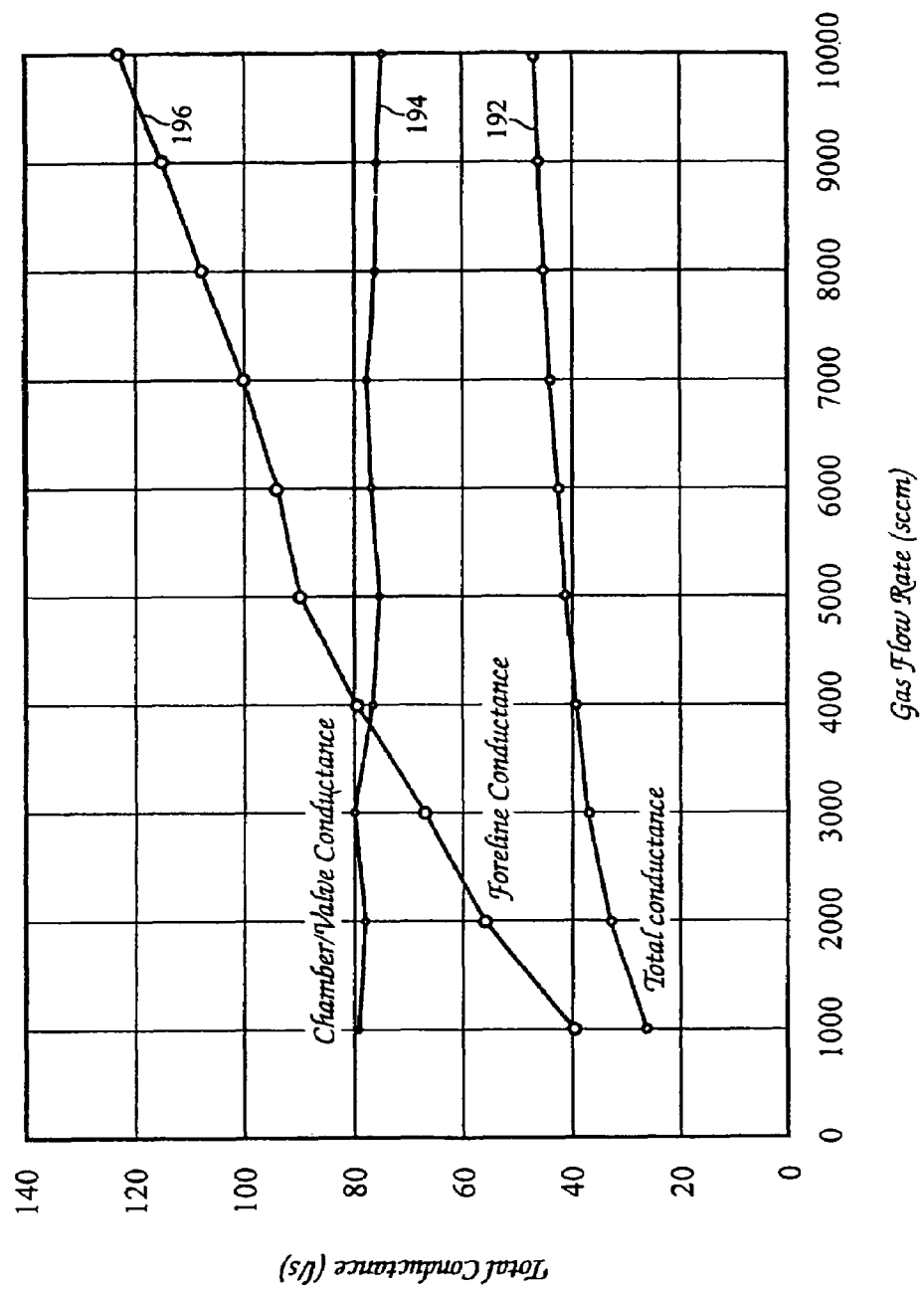
FIG. 4 is a graph showing foreline conductance, chamber and valve conductance, and the total conductance for increasing flow rates of gas in a chamber.

Also, the total pumping conductance loss increases in more than simply an additive function of the conductance loss from the foreline and that from the chamber and valve. For example, FIG. 4 shows the total conductance (line 192) in relation to the chamber and valve conductance (line 194) and the foreline conductance (line 196) for increasing flow of gas in a chamber. The total conductance $C_T$ is given by $1/C_T = 1/C_{C/V} + 1/C_F$ where $C_{C/V}$ is the combined chamber and valve conductance, and $C_F$ is the foreline conductance. Thus, the total conductance $C_T$ is always smaller than the chamber/valve conductance $C_{C/V}$ and is always smaller than the foreline conductance $C_F$ and, in fact, is smaller than the smaller of the two. In addition, while the chamber/valve conductance curve 194 is a relatively straight line for increasing gas flow, the foreline conductance curve 196 increases rapidly as the flow rate of the gas is increased. However, since the total conductance 192 is always smaller than both 194 and 196, even the rapid increase of 196 has a small effect on 192 because 194 has remained relatively constant with increasing gas flows. This is a limiting factor for chambers processing substrates having diameters of 300 mm and higher. FIG. 4 also shows that for gas flows up to 4000 sccm, which cover the majority of semiconductor processes, the foreline conductance is the dominating conductance and has the major effect in lowering the total conductance. Thus, the foreline conductance plays a critical role, and increasing it by using a shorter foreline has a substantial effect on increasing total conductance.

The long forelines result in large losses of pump capacity because of their low conductance. Table I shows calculated foreline losses which are the losses in pump capacity or pumping speed that arise because of the length of the foreline between the pump and chamber, as a function of the length and diameter of the foreline. For example, for a foreline having a constant length of 20 meters, the foreline losses increase from 37% to 65%—as the foreline diameter decreases from 100 to 40 mm. Similarly, for a foreline having a constant diameter of 40 mm, the foreline losses increase from 48% to 65%—as the length of the foreline increases from 10 to 20 m. Thus, the shorter the length of the foreline, the higher the conductance of the foreline and the lower are the pumping losses of the pumping system 155.

Figure 5:
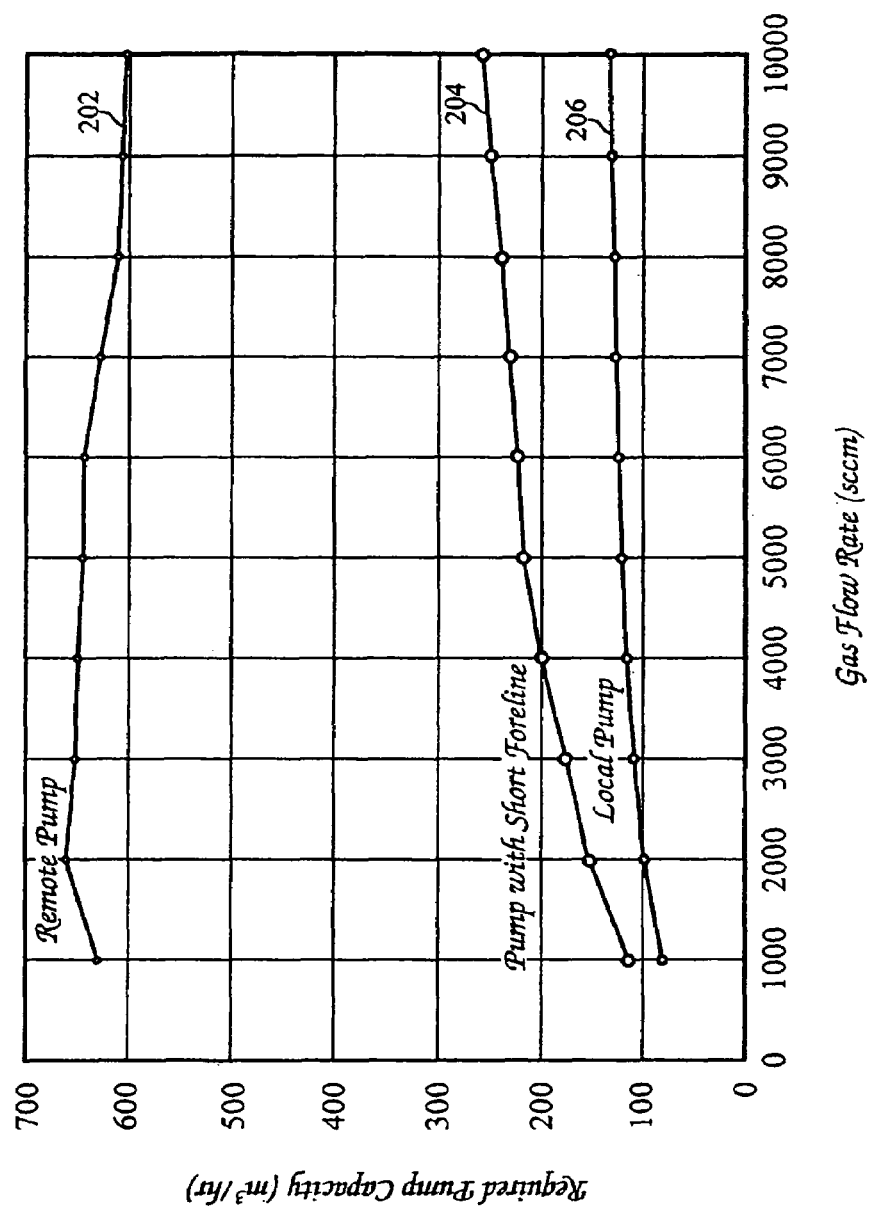
FIG. 5 is a graph showing the required pump capacity (or pumping speed) of a local pump without a foreline, a pump having a short foreline, and a remote pump having a long foreline, as a function of gas flow rate for maintaining the same chamber pressure.

The integrated pumping system 155 illustrated in FIG. 2 operates far more efficiently than the remote pumping system 35 illustrated in FIG. 1, because of the absence of low conductance pipelines, forelines, and valves and also because much smaller capacity pumps can be substituted for the larger capacity remote pumps that are used in conventional apparatus 15. For example, FIG. 5 shows the required pump capacity (or pumping speed) as a function of process gas flow rate for a remotely located pump, a closely located pump with a short foreline, and an abutting pump. Line 202 shows the pumping speed of a conventional remote pump with a long 50-foot foreline 65a–c, and that is located in remote environment from a processing apparatus 15, for example, as shown in FIG. 1. Line 204 shows the pumping speed of a pump 165a,b having a short foreline 190a,b which demonstrates a substantial increase in pumping efficiency, as shown in FIG. 2. Line 206 shows the even higher efficiency of a local abutting pump 165c having no foreline, also as shown in FIG. 2. The difference in height between lines 202 and 206 represents the increase in pump capacity arising from the higher conductance between the pump and the chamber. Thus, foreline losses that accounted for 60 to 80% of the total conductance losses were eliminated by the present pumping system 155.

TABLE I

| | FORELINE | | | | | VACUUM PUMP | | FORELINE |
|---|---|---|---|---|---|---|---|---|
| Pipe Length (m) | Pipe Diameter (in) | Pipe Diameter (mm) | Specific Conductance (lm/s) | Conductance (l/s) | Conductance (m$^3$/hr) | Pump Speed (m$^3$/hr) | Effective Speed (m$^3$/hr) | Piping Losses (%) |
| 20 | 1.5 | 40 | 300 | 15 | 54 | 100 | 35 | 65 |
| 20 | 2 | 50 | 750 | 38 | 135 | 100 | 57 | 43 |
| 20 | 2 | 50 | 750 | 38 | 135 | 250 | 88 | 65 |
| 20 | 3 | 80 | 3000 | 150 | 540 | 250 | 171 | 32 |
| 20 | 3 | 80 | 3000 | 150 | 540 | 500 | 260 | 48 |
| 20 | 3 | 80 | 3000 | 150 | 540 | 1000 | 351 | 65 |
| 20 | 4 | 100 | 9500 | 475 | 1710 | 1000 | 631 | 37 |
| 10 | 1.5 | 40 | 300 | 30 | 108 | 100 | 52 | 48 |
| 10 | 2 | 50 | 750 | 75 | 270 | 100 | 73 | 27 |
| 10 | 2 | 50 | 750 | 75 | 270 | 250 | 130 | 48 |
| 10 | 3 | 80 | 3000 | 300 | 1080 | 250 | 203 | 19 |

TABLE I-continued

| | FORELINE | | | | | VACUUM PUMP | | FORELINE |
|---|---|---|---|---|---|---|---|---|
| Pipe Length (m) | Pipe Diameter (in) | Pipe Diameter (mm) | Specific Conductance (lm/s) | Conductance (l/s) | Conductance (m³/hr) | Pump Speed (m³/hr) | Effective Speed (m³/hr) | Piping Losses (%) |
| 10 | 3 | 80 | 3000 | 300 | 1080 | 500 | 342 | 32 |
| 10 | 3 | 80 | 3000 | 300 | 1080 | 1000 | 519 | 48 |
| 10 | 4 | 100 | 9500 | 950 | 3420 | 1000 | 774 | 23 |

Figure 6:
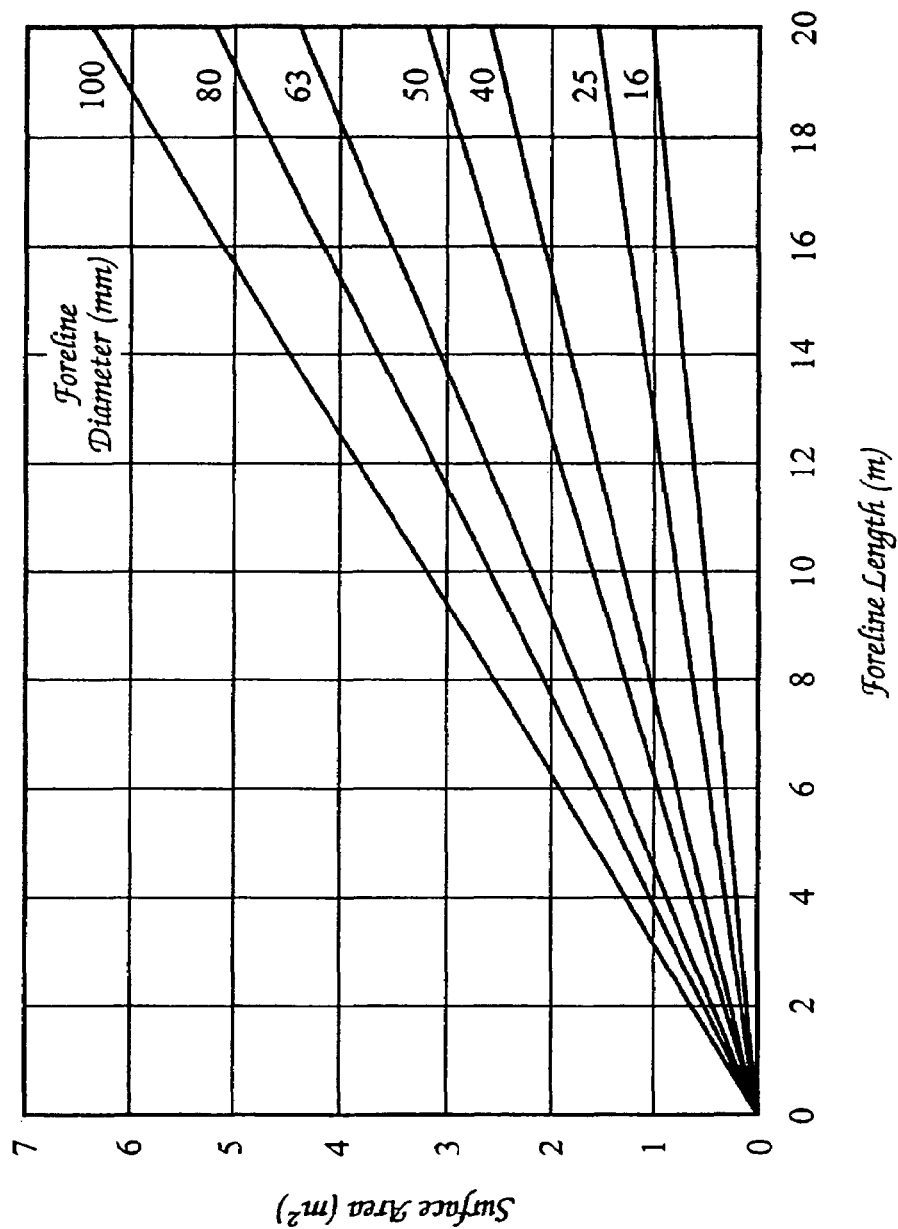
FIG. 6 is a graph showing the increase in deposition surface area of the internal surfaces of a foreline pipe as a function of its length and diameter.

As a result of reducing the length of the foreline 190a,b, it is also possible to use a foreline having a small diameter. This is because a large diameter foreline has a large surface area that serves as a heat sink upon which condensates are deposited from the process gas flowing in the pipeline. These condensates are dislodged and loosened by vibrations from the pumps 165a–c and back diffuse into the chambers 120 to contaminate and reduce the yield of the substrate 20. For example, FIG. 6 shows the increasing deposition area provided by the internal surfaces of forelines having increasing diameters of 16 to 100 mm and foreline lengths. For example, a foreline having a diameter of 40 mm and a length of 1 m has a surface area of approximately 0.128 m², while a foreline having a diameter of 100 mm and a length of 20 m has a surface area of 6.4 m², which is about 50 times larger. The larger area provides a much bigger surface for condensates to be deposited upon from the process gas flowing in the foreline 190a. Therefore, it is desirable to have a foreline with a diameter of less than about 80 mm, and more preferably less than about 50 mm. These smaller diameters reduce the foreline surface area by a factor of 10 from an average of about 4 m² to less than about 0.4 m².

Figure 7:
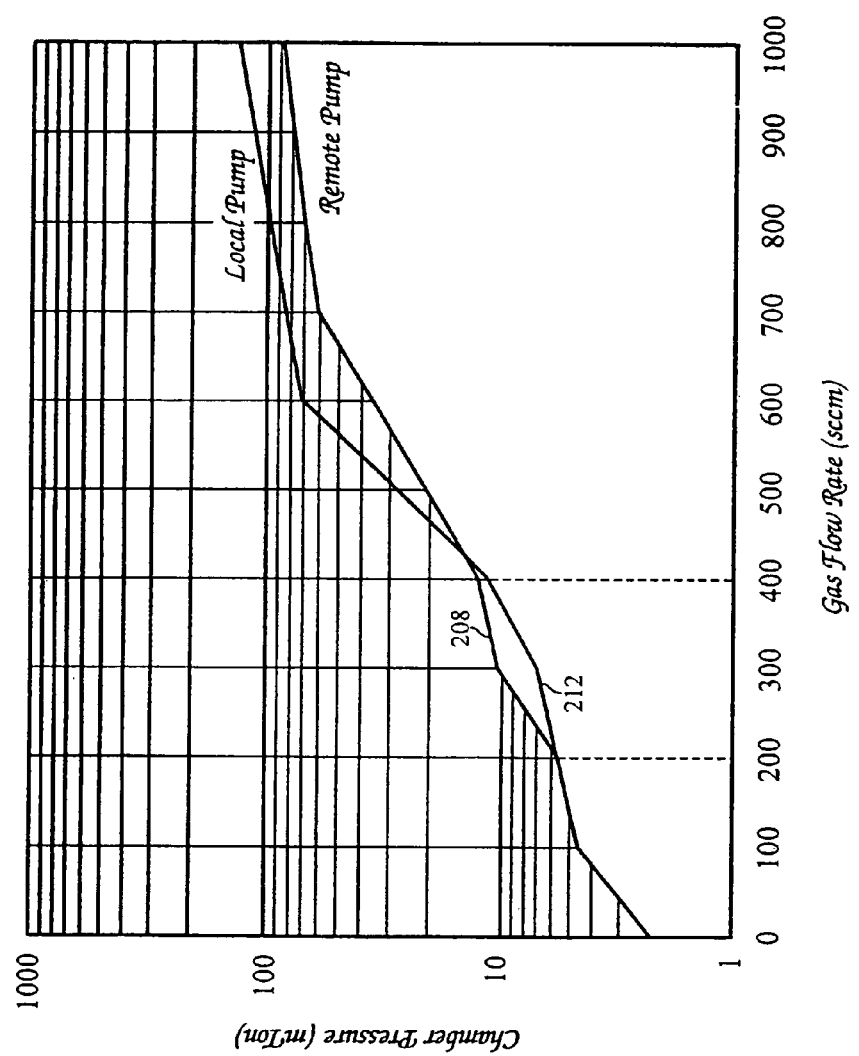
FIG. 7 is a graph of the measured pressure in a chamber for increasing gas flow rates showing the improved processing window obtained by a local pump versus a remote pump.

FIG. 7 is a graph showing the change in pressure in a chamber as a function of increasing gas flow showing the improved processing window obtained by the integrated pumping system 155 as compared to a remote pumping system 35. Line 208 is the pressure versus gas flow curve for a remote set of pumps comprising a 80 m³/hr pre-vacuum pump and a 500 m³/hr low vacuum pump. Line 212 is the curve for an integrated pumping system 155 comprising a single 100 m³/hr pre-vacuum pump. Both pumping systems 35, 155 used a 2000 l/s turbo molecular high vacuum pump 160. The integrated pumping system 155 had two advantages over the remote pumping system 35. First, the dual pumps having capacities of 80/500 were replaced by a single pump having a capacity of 100 m³/hr. In addition, the pump with the large capacity of 500 m³/hr, which used a lot of energy, was expensive and had a large footprint, was eliminated by the much smaller capacity pump of 100 m³/hr. Also, the integrated pumping system 155 obtained wider process window in the flow range of 200 to 400 sccm, which is a commonly used flow range for many processes with lower pressures of 6 to 10 mTorr.

In a preferred embodiment, a pre-vacuum pump 165c is connected directly to a chamber 110 without any length of foreline at all. Eliminating the foreline provides increased pump capacity and reduced contamination from the forelines and valves. This embodiment is especially useful for loadlock chambers 110 that often require rapid cycling between atmospheric pressure and low vacuum pressures of 100 to 300 mTorr. To allow the inlet 170c of the pump 165c to be connected adjacent or abutting the chamber 110, the pump 165c should have a low-level of vibrations during operation, a relatively small size, and not be excessively noisy. By low level of vibration it is meant a vibrational level of less than about 2.5 m/s², and more preferably less than about 1.5 m/s². This is achieved by a low vibration pump design and rotational speeds of less than 10,000 rpm, and more preferably less than 7,000 rpm. The small size of the pump 165c is typically less than about 65 liters, and more preferably less than about 40 liters. These small pump sizes are achieved by higher rotational speed, optimal pumping stages, and motor design. In addition, the pump 165c should not be excessively noisy to allow operation within the clean or grey room. A sufficiently low noise level is below 65 dB, and more preferably less than about 55 dB. This is achieved by reducing mechanical vibrations and gas compression noises.

The pre-vacuum pumps 165a–c can be a roots, screw, hook and claw, tongue and groove, or similar principle. Preferably, the pre-vacuum pump 165a is a screw, roots, hook and claw, or tongue and groove pump that comprises one or more evacuating members that rotate to evacuate gas from a chamber. For example, FIG. 8a shows a schematic of a screw pump having a plurality of screw augers that have interlacing blades. The size of the screw augers and the speed of the shaft controls the pump capacity or speed which is a rate of which the pump evacuates gas from a chamber. FIG. 8b shows a schematic of a roots-type pump which has two or more rotors also with interdigited blades. In another embodiment, as shown in FIG. 8c, the pump comprises a plurality of parallel shafts, each having a hook and claw mechanism that interact with one another to evacuate gas from the chamber. In yet another embodiment, shown in FIG. 8d, the pump comprises a rotating member comprising a tongue and groove mechanism on a plurality of shafts. Combinations of these pump mechanisms are also possible.

Preferably, the pressure of the gas in one or all of the chambers is controlled by an open or a closed loop pressure controller 220 that adjusts a speed of the pump to change the pressure of gas in a chamber. For example, FIG. 2 shows a pressure controller 220 comprising at least one pressure gauge 225 connected to the chamber 120 for providing a pressure signal $P_S$ in relation to the pressure of the gas in the chamber 120. The analog or digital pressure signal $P_S$ is transmitted to a pump controller 230, such as a P, PI, or PID or similar controller and/or a computer system 235, that compares the signal $P_S$ to a target pressure $P_T$, and changes the speed of a motor 240 of the pump 165a in relation to the difference $\Delta P$ between the measured and target pressures. A set of rules, such as proportional-integral-derivative rules, are used to adjust the speed or the pump 165a in proportion to $\Delta P$. As $\Delta P$ becomes larger, the increase in pump speed is set to be correspondingly higher, as $\Delta P$ is reduced, the pump speed is set to be correspondingly lowered. In addition, the internal and exhaust pressures of the pump 165a can also be measured using additional gauges and sensors (not shown). The pump controller 230 can be a single controller or a set of controllers that cooperate to perform the pressure measurement, comparison of measured and set-point pressures, and adjustment of the pump speed.

Preferably, the pump controller 230 changes a rotational speed of the pump 165a. The rotational speed of the pump controls the pump capacity which is the rate of which the pump evacuates a volume of gas from the chamber. Preferably, the pre-vacuum pump 165a has a low rotational speed that is less than about 10,000 rpm, and more preferably less than about 7,000 rpm. The low rpm is advantageous because it reduces the vibration of the pump during use and reduces power consumption and response time during speeding up and down for pressure control.

In another aspect of the present invention, a variable speed pump is operated by a programmable speed controller (now shown) to closely match an optimal complex-shaped curve of pressure reduction versus time in a chamber. The modeled pressure reduction versus time curve for a chamber is used to rapidly reduce the pressure of gas in the chamber and avoid moisture ice condensation. The complex-shaped smooth curve cannot be closely matched by the step changes in opening size of a two-stage or conventional soft-start valve. In contrast, by adjusting the rotational speed of the pump through a predetermined range of speeds that can be continuously varied through an entire range of rpm, it is possible to closely trace and match the optimal pressure/time curve.

FIG. 9 shows the pressure reduction curves obtained for different configurations of remote and the integrated pumping systems 35, 155. In these examples, pre-vacuum pumps 165a–c were positioned in both remote and integrated positions to compare the reduction in pump-down time achieved by the integrated pumps. Both sets of pumps were operated to evacuate a load-lock chamber. The pumps had different pumping capacities and were operated at different rotational speeds to optimize their pump-down process cycle. Referring to FIG. 9, line 272, shows pump-down pressure/time cycles for a remote pump, which has a pump-down time of about 135 seconds. In contrast, lines 284 to 294 are pump-down pressure/time cycles of integrated pumps that were positioned abutting the platform and chambers and with a short foreline having a length of 2 m and a diameter of 50 mm. The local pumps had an average pump-down speed of about 65 seconds, which is twice as fast as the remote pumps.

In these examples, a soft-start valve or a two-step speed adjustment was used in the foreline 76 to control the rate of pressure reduction in the chamber. Some of the pumps used soft-start valves having two opening sizes comprising a small opening size that was initially opened to bring the chamber down from atmospheric pressure to a pressure of 200–300 Torr, and a large opening used to reduce the chamber pressure down to about 0.1 Torr. The change in slopes of the pump down cycles was obtained by either changing from the small to the large valve in the case of the remote pumps, or from one rotational speed to another in the case of the variable speed integrated pumps. For example, the rotational speeds of the pumps were set at one or more of 20, 30, 40, 45, 60, 80, and 100 Hz. Pairs of rotational speeds were used for each integrated pump, including a lower speed and a higher speed, to achieve optimal fast and soft pump down. It is seen that an optimal pump-down cycle was obtained for an integrated pump having a capacity of 100 m³/hr operated at rotational speeds of 40/100 Hz, as shown by lines 290, 294.

FIG. 10 shows a computer-generated model of a pressure reduction curve for a process chamber that can be used to rapidly reduce the pressure of gas in the chamber without ice condensation. The computer simulation model was generated for a chamber having a volume of about 6 liters. The rotational speed of an integrated pump mounted on a process chamber was varied through a selected set of increasing speeds to closely match the pressure reduction curve. The set of pump speeds were selected to closely trace the pump capacity or speed to the maximum allowable capacity denoted by the modeled pressure reduction curve, as shown by line 300. In FIG. 10, line 302 shows the measured pressure reduction curve obtained in the chamber, when the pump was run at 30 m³/hr during the initial pressure reduction from atmospheric pressure to 200 Torr, and thereafter, run at 90 m³/hr for pressure reduction down to 0.1 Torr. Line 302 took the longest time of about 13 seconds to reach 0.1 Torr without ice condensation in the chamber and did not closely match the pressure reduction curve. Line 304 shows the reduction in pressure obtained in the chamber, when the pump was first run at 27 m³/hr during the initial pressure reduction from atmospheric pressure to 200 Torr, and thereafter, run at 90 m³/hr for pressure reduction down to 0.1 Torr. This followed more closely the modeled ice condensation curve and took a shorter time of 11 seconds to reach 0.1 Torr without ice condensation providing an improvement in pump down time of about 2 seconds. Line 306 shows optimal results in which the pump was operated through a set of speeds of 8, 27, 90, and 250 m³/hr, which more closely followed the modeled pressure reduction curve and reduced pump down time from atmospheric pressure to 0.1 Torr in less than about 9 seconds without ice condensation. Thus, a series of continuous or step changes in the effective or rotational speed of the pump provides an optimal pump down cycle that avoids ice condensation in the chamber. The number of step changes depends on the shape of the modeled ice condensation curve, pump capacity, and the volume of the chamber.

The reduction in pump down time is particularly important for the load-lock chamber 110 which is often pumped down from atmospheric pressure to low vacuum pressures. The load-lock chamber 110 is pumped down every time a new batch of substrates is inserted into the load-lock or a processed batch of substrates is removed from the load-lock chamber. Thus, the load-lock chamber 110 is often cycled between atmospheric pressure (during loading and unloading of substrates) and low pressures during processing or transferring of the substrates 20 from the load-lock chamber 110 to a process chamber 120. The large number of pump-down cycles, relative to the process chamber 120 which remains at low pressures throughout processing, require fast pump down cycles from atmospheric to low pressure levels of less than about 0.1 Torr.

The pumping system 155 of the present invention also provides considerable energy conservation over conventional pumping systems 35. The variable speed, integrated, pre-vacuum pump 165a–c can also be operated more efficiently by reducing the high speed maintained during the operational mode to a low speed or power saving idle mode. FIG. 11 is a graph of the electrical power used by the pumping system 155 versus time showing the energy savings obtained during pump-down of a load-lock chamber 110. Initially, from 0 about 18 seconds, the pre-vacuum pump is operated at a relatively low speed of about 30 Hz from atmospheric pressure down to about 200 Torr—during which time the pump uses a relatively small amount of energy of 500 to 750 watts. Thereafter, the pump speed is accelerated from 30 to 100 Hz over a period of 1 to 2 seconds to achieve a vacuum of about 0.1 Torr in the chamber—the peak energy used during this time is about 3000 watts. Once a low pressure equilibrium state of vacuum is obtained in the chamber, even though the pump continues to operate at 100 Hz, a much smaller amount of energy of about 1500 watts can be used to maintain the load-lock chamber at a low pressure. When the load-lock chamber does not contain substrates, the pump is operated in a power saving idle mode at about 30 Hz to use a very small amount of energy of about 500 watts. Conventional pumps operate at a continuous maximum speed of 50 Hz and 60 Hz, depending on the country network frequency, and use from 3,000 to 8,000 watts. In contrast, the variable speed pump operates at a much lower average energy level of about 500 to 1500 watts, thereby consuming about 6 times less energy than conventional pumps.

In another aspect of the present invention, as shown in FIGS. 12a and 12b, the pre-vacuum pump 325 comprises a plurality of inlet ports 330a,b, each connected to an inlet stage 380a,b of the pump 325. In prior art systems, as schematically shown in FIG. 13, each pump 355a,b had one inlet port 360a,b in a single inlet stage 362a,b, respectively. The inlet ports 360a,b were each connected to a separate chamber 350a,b on the platform 352. The use of multiple pumps 355a,b for a single platform 352 resulted in higher capital outlays and increased costs of maintenance of the multiple pumping systems and pipelines, especially when the pumps 355a,b were located at a distant or remote location from the platform 352.

In contrast, as schematically shown in FIG. 12b, a multiple inlet pump 325 according to the present invention, comprises multiple inlet ports 330a,b, each of which are connected to a chamber 355a,b (or a pump) to evacuate the gas in that chamber or pump. Thus, a single pump 325 can perform the work of a multiple set of prior art pumps 355a,b. When the platform 340 comprises a plurality of chambers 335a,b mounted contiguously to one another, a single multiple inlet stage pump 325 is used to pump down one or more of the chambers 325a,b, and thereby increase pumping efficiency, reduce capital costs by eliminating a number of pumps, and save valuable space in the clean room.

The multiple inlet pump 325 comprises a first inlet 330a connected to a first chamber 335a or high vacuum pump (not shown) and a second inlet 330b connected to a second chamber 335b or another high vacuum pump (not shown). For example, the first inlet 330a can be connected to a process chamber, and the second inlet 330b connected to the load-lock or transfer chamber, or both the first and second inlets 330a,b can be connected to separate process chambers. The multiple inlet pump 325 has a vacuum capacity that is capable of evacuating the plurality of chambers from a pressure of one atmosphere down to a pressure of about 0.1 Torr.

The multiple inlet pump 325 comprises one or more rotatable shafts 370a,b in separate gas evacuating stages 380–384. Each stage 380–384 comprises one or more shafts 370a,b having a plurality of interdigited stages or lobes 385 that interlace each other to form the gas evacuating means within that stage. The low-pressure end 380a,b of the pump 325 comprises a plurality of inlet ports 330a,b, each of which are connected to a single chamber 335a,b, respectively. The first and second inlet ports 330a,b can be on a single manifold that terminates to a single inlet stage (not shown) or they can be connected to separate inlet stages 380a,b (as shown). Preferably, the inlet ports 380a,b terminate at one or more separate inlet stages 380a,b that are connected in a parallel arrangement, by which it is meant that the outlets of these two stages do not feed into one another, but instead are combined to feed directly to a second stage 381. Thereafter, the second stage 381 feeds to the third stage 382, the third stage 382 feeds to the fourth stage 383, and the fourth stage 383 feeds to the fifth stage 384, all in series arrangement. The fifth stage 384 comprises a high pressure exhaust outlet 390 that exhausts the evacuated gas to atmosphere. The plurality of stages 380–384 in a series arrangement serve to increase the pumping efficiency or total pressure reduction achievable by the pump. For example, if each of the first, second, third, fourth, and fifth stages has a compression ratio of about 2, a total of five stages in series arrangement will provide a total compression ration of $2^5$ which is about 1000, and the pump can pump down from atmospheric pressure (about 760 Torr) to a thousand times lower or less than about 1 mTorr. Typically each stage of the pump has a compression ratio of from about 2 to about 20.

The multiple inlet pump 325 provides significant cost savings by reducing the total number of pumps, valves, and pressure control systems, that are used on a multi-chamber platform 340. In addition, the footprint of the apparatus 115 is substantially reduced by use of a single pump to perform the task of multiple pumps. Also, the pumping efficiency is increased by reducing the total length of foreline piping and other pipeline obstructions, such as valves 500, which only increase losses. As a result, a pump 325 having a relatively low capacity can be used to evacuate more than one chamber, efficiently, and with good pressure control.

While the present invention has been described in considerable detail with reference to certain preferred versions, many other versions should be apparent to those of ordinary skill in the art. For example, the pre-vacuum pump can comprise a non-rotating mechanism that operates in an equivalent manner to a rotating mechanism, and the chambers can be used to process substrates other than semiconductor wafers. Thus, the apparatus, chamber, pumping system 155, and methods according to the present invention should not be limited to the illustrative embodiments of the invention described herein. Therefore, the spirit and scope of the appended claims should not be limited to the description of the preferred versions contained herein.

What is claimed is:

1. An apparatus for processing a substrate, the apparatus comprising a pump having a plurality of inlet ports, a first inlet port provided to evacuate gas from a first chamber or first pump, and a second inlet port provided to evacuate gas from a second chamber or second pump, the pump abutting at least one of the chambers.

2. The apparatus of claim 1, wherein the pump has a plurality of screw augers with interlacing blades.

3. The apparatus of claim 1, wherein the pump has two or more rotors with interdigited blades.

4. The apparatus of claim 1, wherein the pump has a plurality of parallel shafts, each parallel shaft having a hook and claw mechanism.

5. An apparatus for processing a substrate, the apparatus comprising a multiple inlet pump having a first inlet port in a first inlet stage, and a second inlet port in a second inlet stage, the first inlet port provided to evacuate gas from a first chamber or first pump, and a second inlet port provided to evacuate gas from a second chamber or second pump, the multiple inlet pump abutting at least one of the chambers.

6. The apparatus of claim 5, wherein the multiple inlet pump has a plurality of screw augers with interlacing blades.

7. The apparatus of claim 5, wherein the multiple inlet pump has two or more rotors with interdigited blades.

8. The apparatus of claim 5, wherein the multiple inlet pump has a plurality of parallel shafts, each parallel shaft having a hook and claw mechanism.

9. An apparatus for processing a substrate, the apparatus comprising:
   (a) a plurality of chambers that are shaped and sized to hold one or more substrates; and
   (b) a pump having a first inlet port in a first inlet stage, and a second inlet port in a second inlet stage, the first inlet port provided to evacuate gas from one chamber and a second inlet port provided to evacuate gas from another chamber, the pump abutting at least one of the chambers.

10. The apparatus of claim 9, wherein the pump has a plurality of screw augers with interlacing blades.

11. The apparatus of claim 9, wherein the pump has two or more rotors with interdigited blades.

12. The apparatus of claim 9, wherein the pump has a plurality of parallel shafts, each parallel shaft having a hook and claw mechanism.

\* \* \* \* \*

UNITED STATES PATENT AND TRADEMARK OFFICE
CERTIFICATE OF CORRECTION

PATENT NO. : 7,077,159 B1 Page 1 of 1
APPLICATION NO. : 09/220153
DATED : July 18, 2006
INVENTOR(S) : Peter Reimer, Pedram Sabouri and Dennis R. Smith It is certified that error appears in the above-identified patent and that said Letters Patent is hereby corrected as shown below:

Column 2, Line 47: Change "throughout" to --throughput--

Column 11, Line 15: Change "now" to --not--

Signed and Sealed this

Twenty-first Day of November, 2006

JON W. DUDAS
*Director of the United States Patent and Trademark Office*